(12) United States Patent
Kwon

(10) Patent No.: US 6,285,587 B1
(45) Date of Patent: Sep. 4, 2001

(54) MEMORY CELL STRING STRUCTURE OF A FLASH MEMORY DEVICE

(75) Inventor: Seok-Cheon Kwon, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/593,259

(22) Filed: Jun. 13, 2000

(30) Foreign Application Priority Data

Jun. 24, 1999 (KR) .................................................. 99-24021

(51) Int. Cl.[7] .................................................. G11C 16/00
(52) U.S. Cl. .............................. 365/185.11; 365/185.18; 365/185.28
(58) Field of Search .......................... 365/185.17, 185.11, 365/185.28, 185.18

(56) References Cited

U.S. PATENT DOCUMENTS

| | | | |
|---|---|---|---|
| 4,489,400 | * 12/1984 | Southerland, Jr. | 365/185.17 |
| 5,682,350 | * 10/1997 | Lee et al. | 365/185.17 |
| 5,771,192 | * 6/1998 | Kim et al. | 365/185.17 |
| 5,790,457 | * 8/1998 | Kim et al. | 365/185.17 |
| 5,909,392 | * 6/1999 | Chang et al. | 365/185.17 |

* cited by examiner

Primary Examiner—Tan T. Nguyen
(74) Attorney, Agent, or Firm—Marger Johnson & McCollom, P.C.

(57) ABSTRACT

A nonvolatile semiconductor memory device includes a memory cell array divided into a plurality of memory blocks. A plurality of bit lines are arranged through the plurality of memory blocks, and a plurality of word lines are arranged in each of the memory blocks so as to intersect the bit lines. Each of the memory blocks includes a plurality of memory cell strings corresponding to the bit lines. Each memory cell string includes a first string segment having a plurality of EEPROM cells and a second string segment having a plurality of EEPROM cells. A first select transistor connects the first string segment to a corresponding bit line in response to a first select signal. A second select transistor connects the first string segment to the second string segment in response to a second select signal. And a third select transistor connects the second string segment to a common source line in response to a third select signal.

18 Claims, 10 Drawing Sheets

Fig. 4A
(Prior Art)

| Block | Erase Operation | | Program Operation | | Read Operation | |
|---|---|---|---|---|---|---|
| | Select | Unselect | Select | Unselect | Select | Unselect |
| SSL | Floating | Floating | Vcc | GND | Vread | GND |
| GSL | Floating | Floating | GND | Floating | Vread | Floating |
| CSL | Floating | Floating | GND | GND | GND | GND |
| Substrate | Vera | Vera | GND | GND | GND | GND |
| BL0 | Floating | Floating | Vcc | Vcc | ≒GND | ≒GND |
| BL1 | Floating | Floating | GND | GND | ≒1V | ≒1V |
| Unselect WL | GND | Floating | Vpass | Floating | Vread | Floating |
| Select WL | GND | Floating | Vpgm | Floating | GND | Floating |

Fig. 7

| Block | Erase Operation | | Program Operation | | Read Operation | |
|---|---|---|---|---|---|---|
| | Select | Unselect | Select | Unselect | Select | Unselect |
| SSL | Floating | Floating | Vcc | GND | Vread | GND |
| GSL | Floating | Floating | GND | Floating | Vread | Floating |
| CSL | Floating | Floating | GND | GND | GND | GND |
| IL | Floating | Floating | Vcc/GND | Floating | Vread | Floating |
| Substrate | Vera | Vera | GND | GND | GND | GND |
| BL0 | Floating | Floating | Vcc | Vcc | ≒GND | ≒GND |
| BL1 | Floating | Floating | GND | GND | ≒1V | ≒1V |
| Unselected WL (Unselected String Segment) | GND | Floating | Vcc/GND | Floating | Vread | Floating |
| Unselect WL (selected String Segment) | GND | Floating | Vpass | Floating | Vread | Floating |
| Select WL (selected String Segment) | GND | Floating | Vpgm | Floating | GND | Floating |

MEMORY CELL STRING STRUCTURE OF A FLASH MEMORY DEVICE

This application claims priority from Korean Patent Application No. 1999-24021, filed on Jun. 24, 1999, the contents of which are herein incorporated by reference in their entirety.

FIELD OF THE INVENTION

The present invention relates to a flash memory device, and, in particular to a memory cell string structure of the flash memory device.

BACKGROUND OF THE INVENTION

Generally, semiconductor memory devices for storing data are classified as either volatile semiconductor memory devices or nonvolatile semiconductor memory devices. Volatile semiconductor memory devices lose their data at power-off, while nonvolatile semiconductor memory devices maintain their data even without power. Because of their ability to store information in the absence of power, nonvolatile semiconductor memory devices have been widely used in applications where power may be interrupted suddenly.

A nonvolatile semiconductor memory device, such as a flash memory device, includes electrically erasable and programmable ROM cells, referred to as "flash EEPROM cells." Commonly, a flash EEPROM cell includes a cell transistor having a semiconductor substrate (or bulk) of a first conductive type (e.g., P-type), a source region and a drain region of a second conductive type (e.g., N-type) spaced apart from each other, a floating gate for storing charges placed over a channel region between the source and drain regions, and a control gate placed over the floating gate.

As known in the art, a flash memory device may contain a column-by-column array of NAND EEPROM cells having the general construction illustrated in cross-section by FIG. 11.58 and schematically by FIG. 11.59 in a handbook by B. Price et al., entitled Semiconductor Memories, John Wiley & Sons Ltd., pp. 603–604 (1991), incorporated herein by reference. A cross-sectional view showing the general construction of a column of NAND EEPROM cells and a corresponding schematic circuit diagram are provided in FIG. 3.

FIG. 1 is a block diagram illustrating the overall construction of a conventional flash memory device having the foregoing cell structure. Referring to FIG. 1, the conventional memory device 1 includes an array 10 divided into a plurality of memory blocks BLKm (where m=0–i). Each of the memory blocks BLK0-BLKi includes a plurality of memory cell strings, configured as illustrated in FIG. 2.

Referring to FIG. 2, each string is connected to a corresponding bit line BLn (where n=0–j), and has a string select transistor SST, a ground select transistor GST, and a plurality of flash EEPROM cell transistors M0 to M15 connected in series between a source of the string select transistor SST and a drain of the ground select transistor GST. A drain of the string select transistor SST in each string is connected to a corresponding bit line BLn, and a source of the ground select transistor GST therein is coupled to a common source line (or "common signal line") CSL. Gates of the string select transistors SST in the strings are connected in common to a string select line SSL, and gates of the ground select transistors GST therein are coupled in common to a ground select line GSL. Control gates of the flash EEPROM cell transistors M0–M15 in the strings are each coupled to a corresponding one of word lines WL0–WL15. The bit lines BL0–BLj are electrically connected to a sense amplifier circuit 16 (see FIG. 1). As is well known to ones skilled in the art, the sense amplifier circuit 16 of the NAND-type flash memory device is made up of a plurality of page buffers.

Returning to FIG. 1, the conventional NAND-type flash memory device 1 further comprises a row address buffer and decoder circuit 12, a column address buffer and decoder circuit 14, a Y-pass gate circuit 18, an input/output buffer circuit 20, a global buffer circuit 22, a command register 24, and a control logic and high voltage generator 26. The NAND-type flash memory device is disclosed in a data book, entitled "Flash Memory," published by SAMSUNG ELECTRONICS CO. Ltd., pp. 53–76, (March, 1998) (KM29U128T, 16MH8Bit NAND Flash Memory), incorporated herein by reference.

Referring to FIGS. 1 and 2, one of the memory blocks BLK0–BLKi is selected by a corresponding block decoder according to output signals from the row address buffer and decoder circuit 12. The lines SSL, WL0–WLi, and GSL of the selected memory block are supplied with drive voltages depending on a selected mode of operation, e.g., a program mode or a read mode. Data read out from the selected memory block is transferred to the I/0 buffer circuit 20 through the Y-pass gate circuit 18, which is controlled by the column address buffer and decoder circuit 14. And data to be written into the array 10 is transferred to the sense amplifier circuit 16 through the Y-pass gate circuit 18 and the I/O buffer circuit 20. Writing (comprising a program operation and an erase operation) and reading operations are controlled by the command register 24 and the control logic and high voltage generator 26.

FIG. 4A is a table showing bias conditions of memory cells according to each mode of operation, and FIG. 4B is a timing diagram illustrating signal levels during a programming operation according to the above-described flash memory device. Referring to FIGS. 4A and 4B, the program operation of the conventional flash memory device will now be more fully described with respect to two bit lines, i.e., BL0 and BL1.

As is well known in the art, during a program operation of a memory device, all of the memory cells that are connected to a selected row or a selected word line are simultaneously programmed. During programming, a word line WL1 in a selected memory block (e.g., BLK0) is selected, and the bit lines BL0 and BL1 are supplied with voltages based on data to be programmed into the memory cells. For example, in order to program data '1', a bit line is supplied with a power supply voltage potential (e.g., Vcc). In order to program data '0', on the other hand, a bit line is supplied with a ground voltage potential (e.g., GND).

As illustrated in FIGS. 4A and 4B, the selected word line WL1 is supplied with a positive high program voltage Vpgm, and unselected word lines WL0 and WL2 to WL15 are supplied with a positive pass voltage Vpass less than the program voltage Vpgm. The string select line SSL in the selected memory block BLK0 is supplied with a power supply voltage Vcc, and the ground select line GSL therein is supplied with the ground voltage GND. When a voltage of the selected word line WL1 transitions from GND to Vpgm and voltages of the unselected word lines WL0 and WL2 to WL15 transition from GND to Vpass, each channel of the respective strings corresponding to the bit lines BL0 and BL1 is boosted up to a predetermined program inhibit voltage Vpi by a capacitor coupling.

At this time, the string select transistor SST connected to the bit line BL1 is biased with Vcc applied to its gate, GND to its drain and Vpi to its source. Thus, the string select transistor SST is turned on, and the boosted program inhibit voltage Vpi of the channel is discharged to GND. A selected memory cell M1 (in the selected bit line BL1 and connected to the selected word line WL1) is programmed by F-N tunneling due to a voltage potential difference between its control gate and its drain and between its control gate and its source. That is, a substantial quantity of electrons are injected into the floating gate of the selected memory cell M1, and a threshold voltage of the cell M1 is shifted from a negative threshold voltage to a positive threshold voltage.

At the same time, however, the string select transistor SST connected to the non-selected bit line BL0 is biased with Vcc applied to its gate, Vcc to its drain and Vpi to its source. Thus, the string select transistor SST is turned off, and the boosted voltage Vpi of the channel is maintained (i.e., it is not discharged). A non-selected memory cell M1 (in the non-selected bit line BL0 and connected to the word line WL1) is program-inhibited because the potential difference sufficient to generate the F-N tunneling is not allowed to form between its control gate and its drain and between its control gate and its source. The memory cell M1 in the non-selected bit line BL0 is therefore maintained in a depletion-type transistor state, having a negative threshold voltage that represents an erased state.

As is also well known in the art, since a positive high pass voltage Vpass is applied to control gates of memory cells connected to unselected word lines WL0 and WL2 to WL15, the memory cells in the unselected word lines may be soft programmed. Soft programming is referred to as a "pass voltage (Vpass) stress" and influences program characteristics. The degree of being soft programmed, however, can be controlled so as not to affect overall programming characteristics. Since sixteen memory cells are arranged in each string, each memory cell in the string suffers the pass voltage stress as much as fifteen times. As the number of memory cells in a string is increased, each cell suffers more pass voltage stress.

The pass voltage stress can be mitigated by lowering a level of the pass voltage Vpass which is supplied to unselected word lines. As the pass voltage Vpass is lowered, however, the program inhibit voltage Vpi is also lowered. As noted previously, the program inhibit voltage Vpi is used to program inhibit non-selected memory cells. Accordingly, as the pass voltage Vpass is lowered, this means that the possibility of soft programming non-selected memory cells is also increased. Soft programming due to insufficient program inhibit voltages is referred to as a "program voltage (Vpgm) stress." Mitigation of the pass voltage stress therefore conflicts with mitigation of the program voltage stress.

In general, a block decoder to a memory block is laid out in a string pitch where memory cells in one string are arranged. Since the string pitch is continuously being reduced due to increased integration of memory cells, it is becoming more and more difficult to lay out the decoder in the string pitch. Conventionally, in order to lay out the decoder in the string pitch, the number of memory cells in a string has to be increased. Unfortunately, problems arise when the number of memory cells in the string is increased. One significant problem is that each memory cell in the string suffers an increased amount of pass voltage stress proportional to the increased number of memory cells in the string. Furthermore, since the number of word lines supplied with the pass voltage Vpass is increased, a pass voltage generator of larger capacitance is also required. The industry is therefore in need of a memory cell string array that permits an increase in the number of memory cells per string without increasing the pass voltage stress on each cell.

SUMMARY OF THE INVENTION

It is therefore an object of the invention to provide a memory cell string structure of a NAND-type flash memory device capable of increasing the number of memory cells per cell string without increasing the pass voltage stress on the memory cells. According to this invention, a nonvolatile semiconductor memory device includes an array divided into a plurality of memory blocks. A plurality of bit lines are arranged through the plurality of memory blocks and a plurality of word lines are arranged in each memory block so as to intersect with the bit lines. Each memory block includes a plurality of memory cell strings. Each memory cell string corresponds to one of the bit lines and includes a first string segment having a plurality of EEPROM cells and a second string segment also having a plurality of EEPROM cells. A first select transistor connects the first string segment to a corresponding bit line in response to a first select signal. A second select transistor connects the first string segment to the second string segment in response to a second select signal. And a third select transistor connects the second string segment to a common source line in response to a third select signal.

BRIEF DESCRIPTION OF THE DRAWINGS

The foregoing objects, features, and advantages of the present invention will become more readily apparent from the following detailed description of a preferred embodiment, made with reference to the following figures, in which:

FIG. 4A is a table showing bias conditions of memory cells according to various modes of operation of the memory device of FIG. 1;

FIG. 7 is a table showing bias conditions of memory cells according to various modes of operation of a memory device having the memory cell array of FIG. 5;

DESCRIPTION OF THE PREFERRED EMBODIMENT

Figure 1:
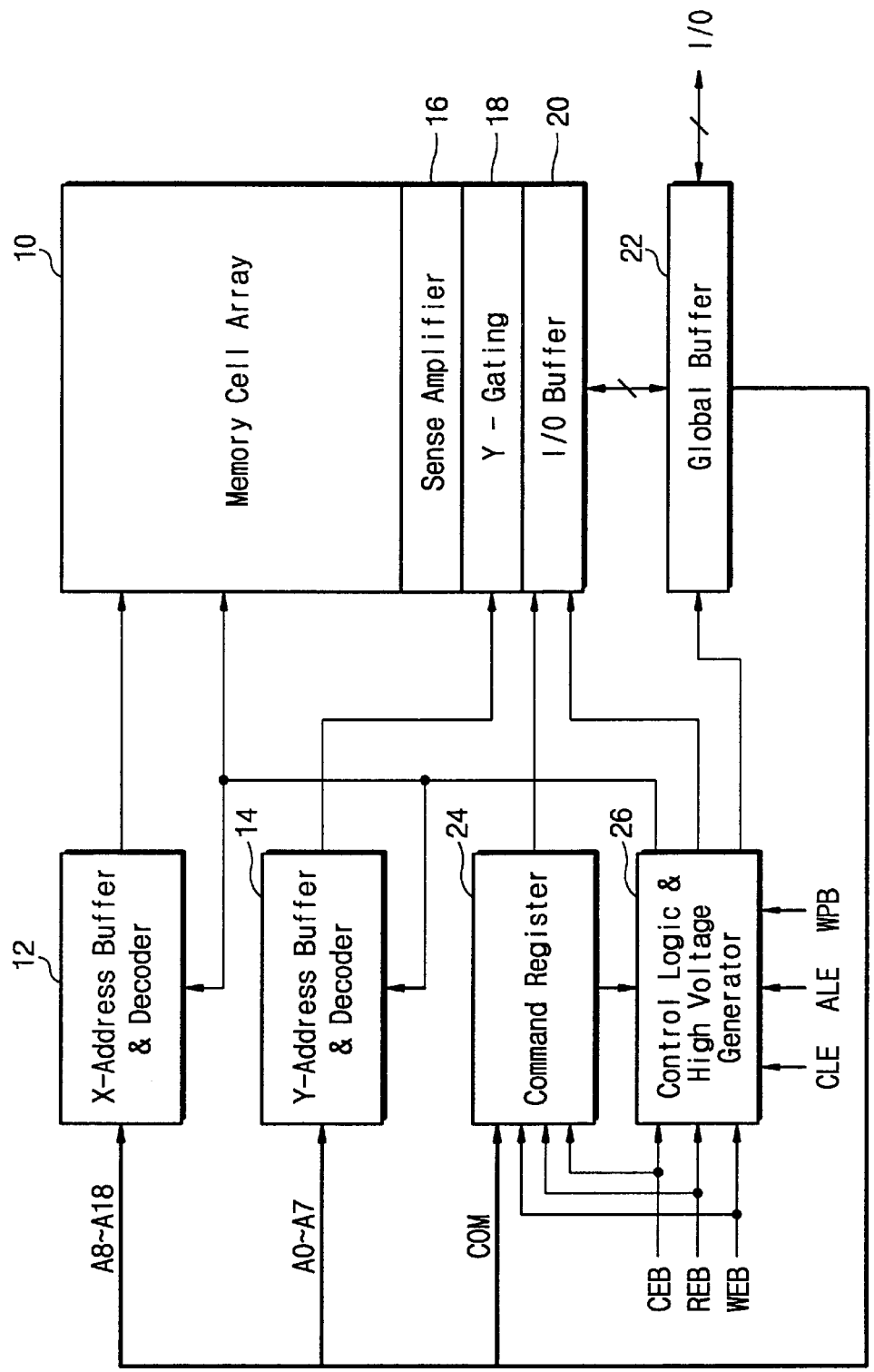
FIG. 1 is a block diagram illustrating the overall construction of a conventional flash memory device.
Figure 2:
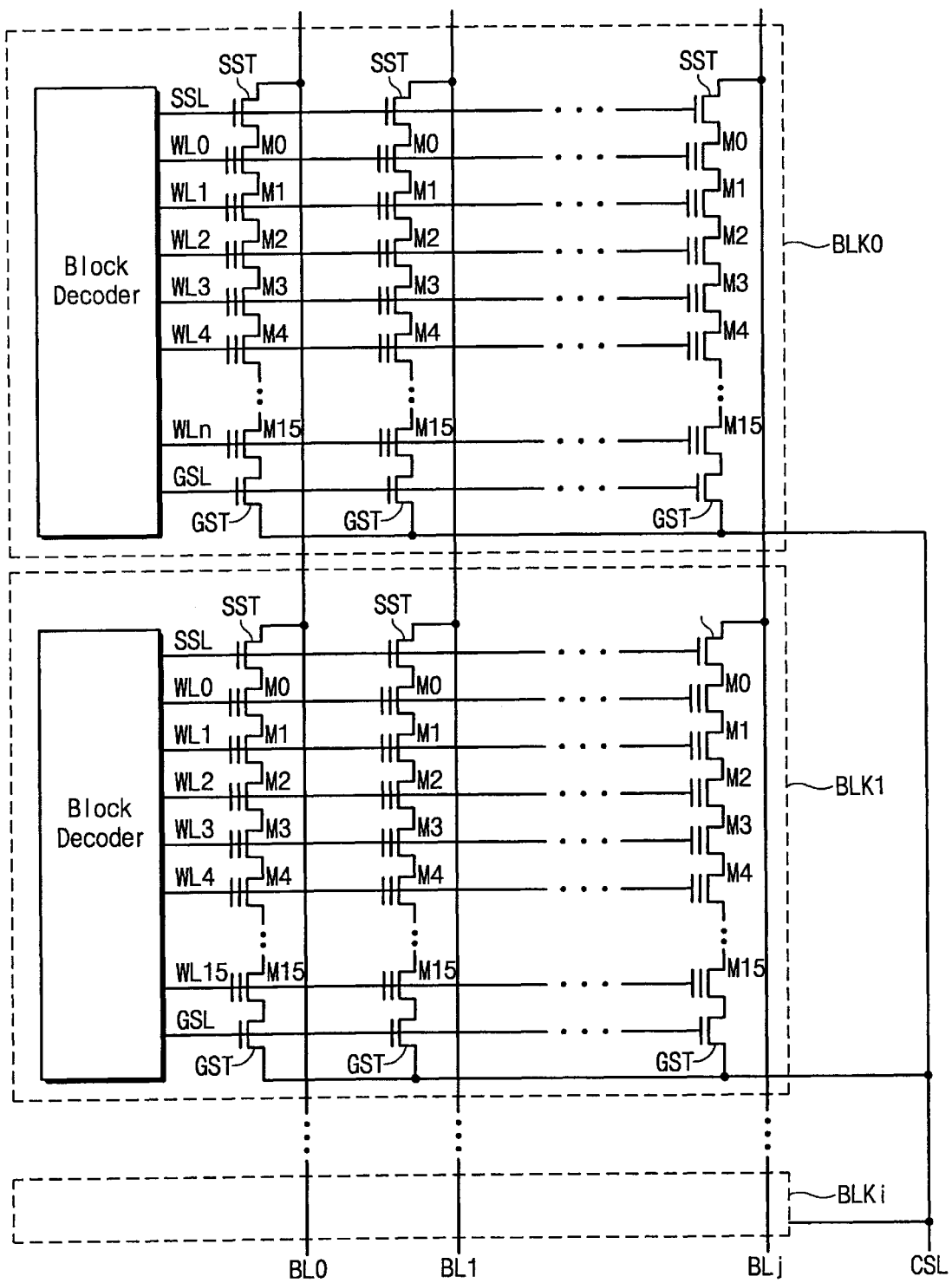
FIG. 2 is a schematic circuit diagram showing a conventional memory cell array of the flash memory device of FIG. 1.
Figure 3:
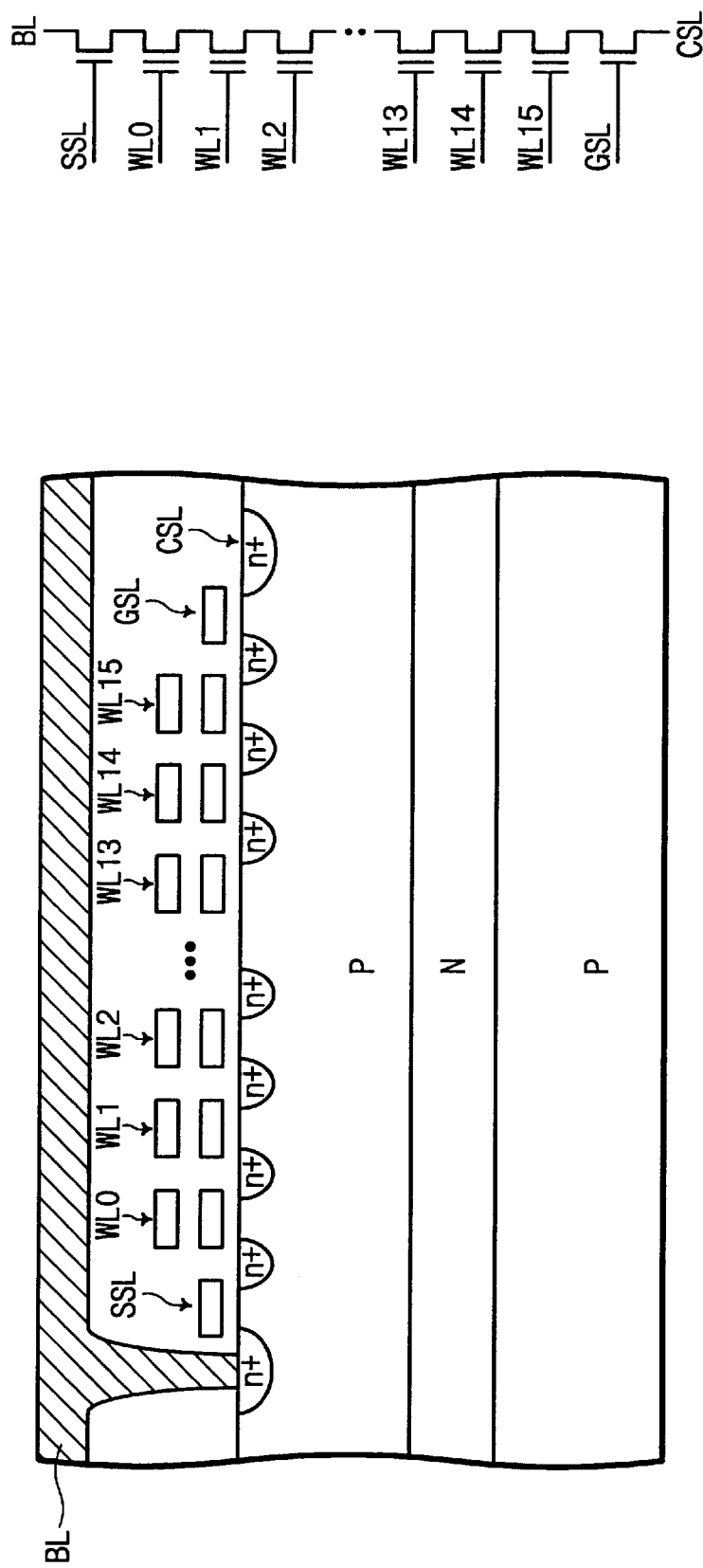
FIG. 3 is a somewhat schematic cross-sectional view and circuit diagram of a string of the memory cell array of FIG. 2.
Figure 4B:
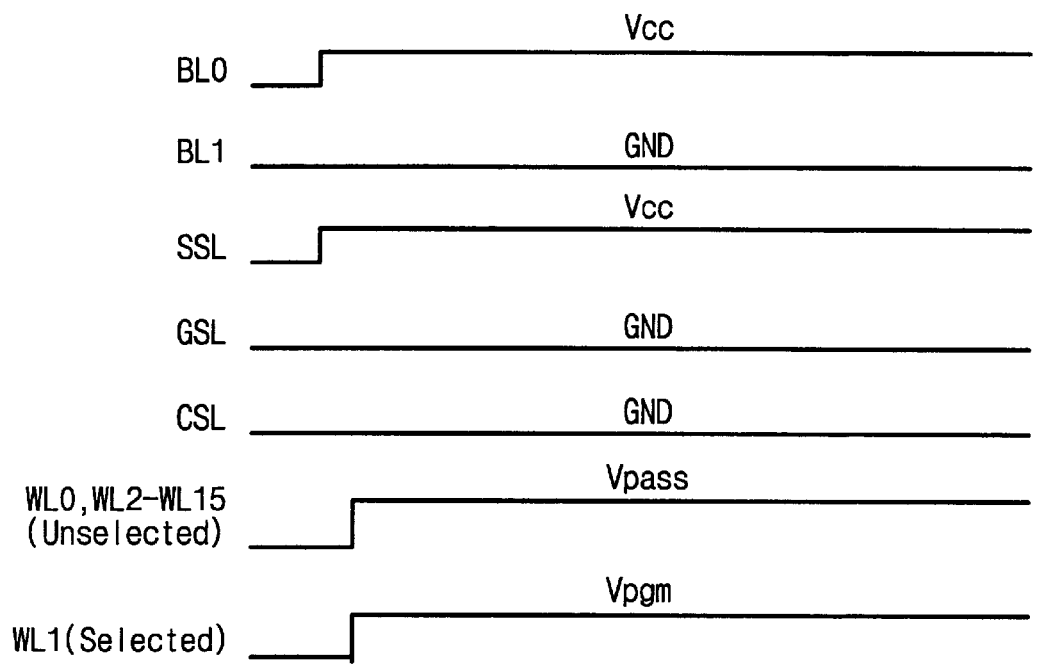
FIG. 4B is a timing diagram illustrating signal levels during a program operation of the flash memory device of FIG. 1.
Figure 5:
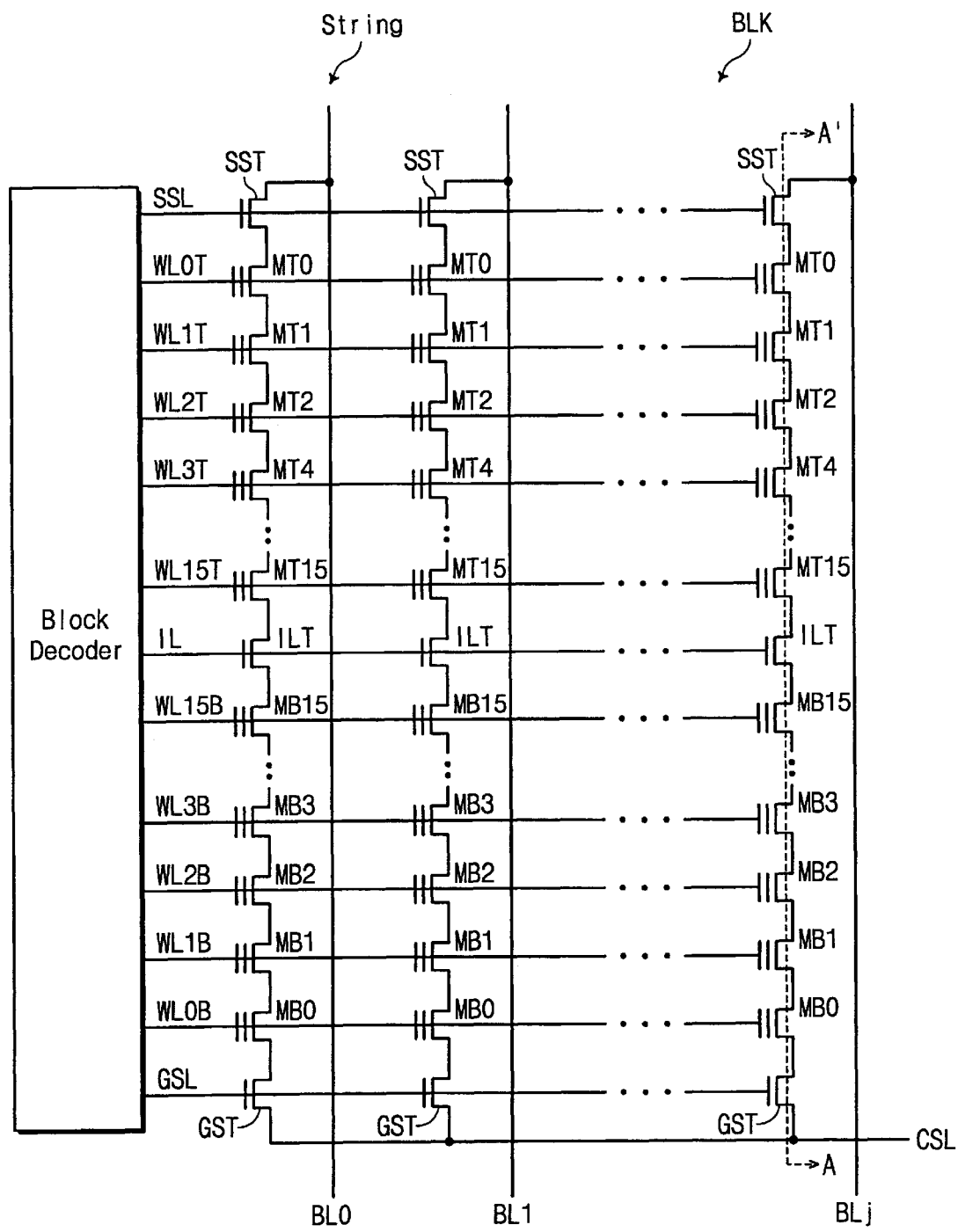
FIG. 5 is a schematic circuit diagram illustrating a memory cell array structure according to a preferred embodiment of the present invention.
Figure 6:
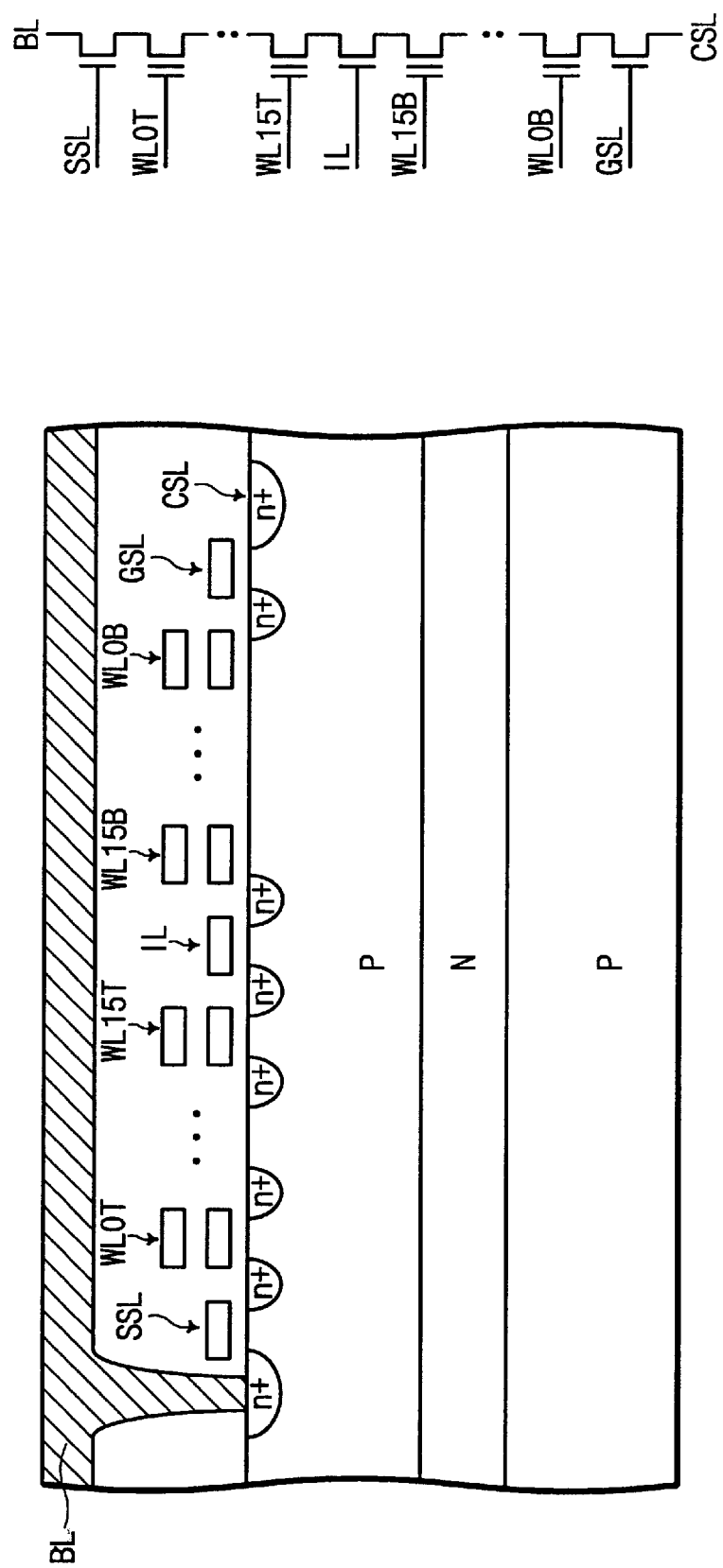
FIG. 6 is a somewhat schematic cross-section view of the memory cell array structure of FIG. 5, taken along a dotted line A–A'.

A preferred embodiment of the present invention will now be more fully described. Referring to FIGS. 5 and 6, although only one memory block is illustrated, the remaining memory blocks in the NAND-type flash memory device according this embodiment are configured the same as the block shown FIG. 5. Furthermore, the NAND-type flash memory device according to this embodiment comprises peripheral constituent elements as described with respect to the prior art memory device illustrated in FIG. 1.

Referring specifically to FIG. 5, a memory block BLK according to the preferred embodiment of this invention comprises a plurality of memory cell strings, each corresponding to one of the bit lines BL0 to BLj, respectively. Each of the strings comprises three NMOS transistors SST, ILT, and GST, which function as select transistors. The string select transistor SST has a gate, a source, and a drain. The drain of the string select transistor SST is connected to a corresponding bit line and its gate is connected to a string select line SSL. The ground select transistor GST also has a drain, a source, and a gate. The source of the ground select transistor GST is connected to a common source line CSL and its gate is connected to a ground select line GSL.

Sixteen flash EEPROM cells MT0 to MT15 are connected in series between the source of the string select transistor SST and a drain of the intermediate transistor ILT. The string select transistor SST, the memory cells MT0 to MT15, and the intermediate transistor ILT constitute a first string segment. Control gates of the memory cells MT0 to MT15 are connected to corresponding word lines WL0T to WL15T, respectively. A gate of the intermediate transistor ILT is connected to a signal line IL.

Similarly, sixteen flash EEPROM cells MB15 to MB0 are connected in series between a source of the intermediate transistor ILT and the drain of the ground select transistor GST. Control gates of the cells M15 to MB0 are connected to corresponding word lines WL15B to WL0B, respectively. The intermediate transistor ILT, the memory cells MB15 to MB0, and the ground select transistor GST constitute a second string segment. Each string according to the present invention includes a first string segment and a second string segment. Using this string structure, the string pitch can be reduced to scale down the memory cell and a decoder for a memory block can be laid out in the string pitch without increasing the pass voltage stress or the program voltage stress on the memory cells.

Erase, program and read operations according to the preferred embodiment of the present invention will now be described in detail with reference to FIGS. 7, 8A, and 8B.

Erase Operation

During an erase operation, a substrate in a selected memory block is supplied with a high erase voltage Vera, while all the word lines WL0T to WL15T and WL0B to WL15B are supplied with a ground voltage GND. The signal lines SSL, IL, and GSL, each connected to the gate of one of the select transistors SST, ILT, and GST, respectively, are maintained at a floating state. On the other hand, in each of the unselected memory blocks, all of the word lines WL0T to WL15T and WL0B to WL15B, the string select line SSL, an intermediate line IL and the ground select line GSL are maintained at a floating state during erasing.

Since a potential difference corresponding to the high erase voltage Vera arises between each control or floating gate and the substrate, F-N tunneling results. This causes electrons in the floating gate of each cell to be discharged to the substrate. That is, the erasing operation causes each memory cell of the selected memory block to have a negative threshold voltage.

Meanwhile, since the signal lines SSL, GSL, and IL of the selected memory block, and the signal lines SSL, GSL, and IL and the word lines of each unselected memory block, are each in a floating state, they are boosted up to a predetermined voltage level by a capacitor coupling when the voltage of the substrate transitions from GND to Vera. At this time, a potential difference between each memory cell gate of each unselected memory block and the substrate is less than that required for forming the F-N tunneling. All the memory cells of each of the unselected memory block are therefore erase-inhibited Accordingly, in the select transistors SST, ILT, and GST of each memory block, a potential difference between a gate of each transistor and a substrate is lower than that of the conventional erase operation. The stress owing to a high erase voltage Vera applied to the substrate is therefore reduced, and the characteristic deterioration of the respective transistors SST, ILT, and GST can thereby be mitigated.

Read Operation

During a read operation, the string select line SSL of each unselected memory block is biased with GND to turn off each string select transistor SST of the unselected memory blocks. This prevents the potential on the bit lines from being discharged into strings in the unselected memory blocks.

In a selected memory block, the lines SSL, IL, and GSL and the unselected word lines are supplied with a predetermined read voltage Vread so that each of the transistors SST, ILT, and GST, and the unselected cell transistors, function as pass transistors. A ground voltage GND is applied to a selected word line. If a memory cell connected to the selected word line stores data '1' or has a threshold voltage of an erased cell transistor, the memory cell is turned on, and the sense amplifier circuit 16 detects it as an ON cell. On the other hand, if a memory cell connected to the selected word line stores data '0' or has a threshold voltage of a programmed cell transistor, the memory cell is turned off, and the sense amplifier circuit 16 detects it as an OFF cell.

Program Operation

According to a program operation of the present invention, memory cells MT0 to MT15 corresponding to a first string segment of each string are programmed separately from memory cells corresponding to a second string segment of each string. That is, when the memory cells MT0 to MT15 of the first string segment are programmed, the memory cells MB0 to MB15 of the second string segment are program-inhibited. On the other hand, when the memory cells MB0 to MB15 of the second string segment are programmed, the memory cells MT0 to MT15 of the first string segment are program-inhibited.

The program operation will now be described in further detail with reference to two bit lines, i.e., BL0 and BL1. During the program operation, a word line WL1 in a selected memory block is selected, and the bit lines BL0 and BL1 are supplied with voltages based on data to be programmed. For example, in order to program data '1', a bit line is supplied with a power supply voltage potential (e.g., Vcc). In order to program data '0', on the other hand, the bit line is supplied with a ground voltage potential (e.g., GND).

Figure 8A:
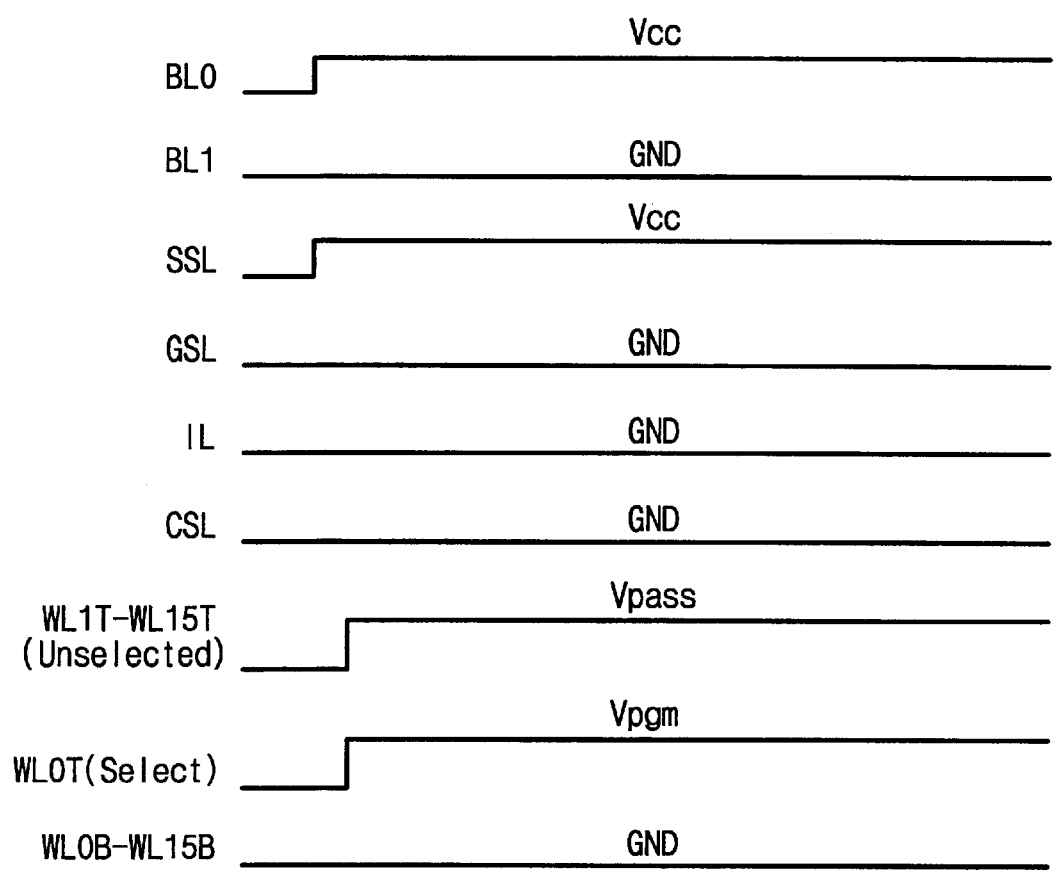
FIG. 8A is a timing diagram illustrating signal levels during a program operation of a first string segment of a string of the memory cell array of FIG. 5.
Figure 8B:
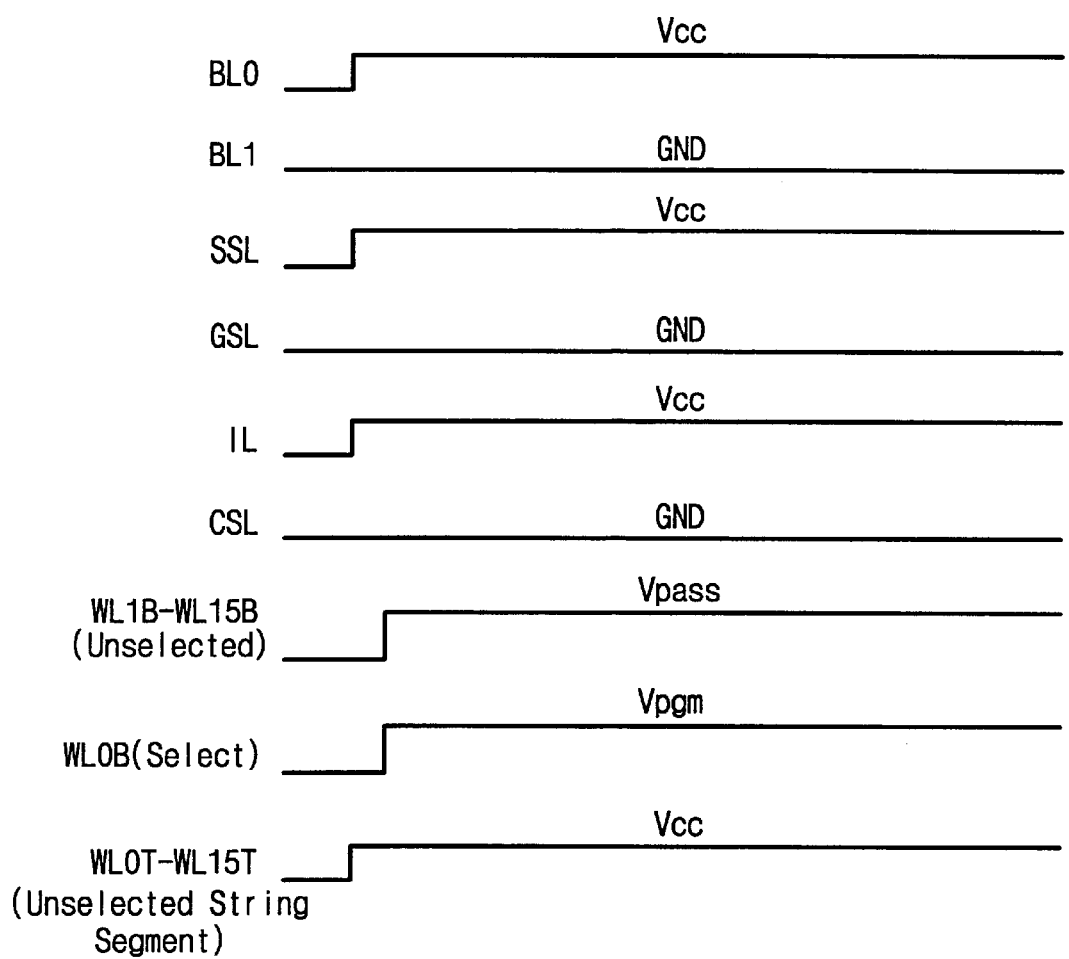
FIG. 8B is a timing diagram illustrating signal levels during a program operation of a second string segment of a string of the memory cell array of FIG. 5.

As illustrated in FIG. 7 and FIG. 8A, a ground voltage GND is applied to the lines GSL, IL, and CSL and the substrate, respectively, while a power supply voltage Vcc is applied to the string select line SSL. The bit line BL0 is supplied with the source voltage Vcc corresponding to data '1', and the bit line BL1 is supplied with the ground voltage GND corresponding to data '0'. The ground voltage GND is also applied to the word lines WL0B to WL15B, which are arranged between the lines IL and GSL or between the transistors ILT and GST. Accordingly, the word lines WL0B to WL15B corresponding to the second string segment are grounded. At the same time, a high program voltage Vpgm is applied to a selected one (e.g., WL0T) of the word lines WL0T to WL15T corresponding to the first string segment. A high pass voltage Vpass, lower than the program voltage Vpgm, is supplied to the unselected word lines WL1T to WL15T.

When a voltage of the selected word line WL0T transitions from GND to Vpgm and voltages of the unselected word lines WL1T to WL15T transition from GND to Vpass, the channel of each of the first string segments corresponding to the bit lines BL0 and BL1 is boosted up to a predetermined program inhibit voltage Vpi by a capacitor coupling. The string select transistor SST, connected to the bit line BL1, is then biased with the source voltage Vcc applied to its gate, the ground voltage GND applied to its drain, and the program inhibit voltage Vpi applied to its source. This turns the string select transistor SST on, and thereby causes the boosted program inhibit voltage Vpi of the channel to be discharged to GND.

A selected memory cell MT0 (corresponding to the bit line BL1 and the word line WL0T) is programmed as a result of the F-N tunneling created by the potential difference (corresponding to the program voltage Vpgm) between its control gate and its drain and between its control gate and its source. In other words, a substantial quantity of electrons are injected into the floating gate of the selected memory cell MT0, and a threshold voltage of the cell MT0 is shifted into a positive threshold voltage from a negative threshold voltage.

On the other hand, the string select transistor SST connected to the bit line BL0 is biased with the source voltage Vcc applied to its gate and its drain, and with the program inhibit voltage Vpi applied to its source. This turns the string select transistor SST off, and the boosted program inhibit voltage Vpi of the channel is therefore not discharged, but is, instead, maintained on the channel. Accordingly, a non-selected memory cell MT0 (in the unselected bit line BL0 and the selected word line WL0T) is program-inhibited because the potential difference sufficient to generate the F-N tunneling is not formed between its control gate and its drain and between its control gate and its source. As a result, the memory cell MT0 corresponding to the unselected bit line BL0 is maintained in a depletion-type transistor state, having a negative threshold voltage corresponding to an erased state. Significantly, since the ground voltage GND is applied to the word lines WL0B to WL15B between the transistors ILT and GST, the memory cells MB0 to MB15 corresponding to the second string segment suffer no stress which would cause the threshold voltages of the cells MB0 to MB15 in the unselected string segment to be changed.

A program operation with regard to the second string segment will now be described with reference to FIG. 7 and FIG. 8B. When a voltage potential corresponding to a high data level '1' is applied to the bit line BL0 and a voltage potential corresponding to data '0' is applied to the bit line BL1, the ground select line GSL and the substrate are supplied with the ground voltage GND. The power supply voltage Vcc is applied to the word lines WL0T to WL15T of the first string segment, the string select line SSL, and the intermediate line IL. At the same time, a high program voltage Vpgm is applied to a selected one (e.g., WL0B) of the word lines WL0B to WL15B corresponding to the second string segment. A high pass voltage Vpass, lower than the program voltage Vpgm, is applied to unselected word lines WL1B to WL15B.

When a voltage of the selected word line WL0B transitions from GND to Vpgm and voltages of the unselected word lines WL1B to WL15B transition from GND to Vpass, the channel of each of the second string segments corresponding to the bit lines BL0 and BL1 is boosted up to a predetermined program inhibit voltage Vpi by a capacitor coupling. Since the word lines WL0T to WL15T are biased with the source voltage Vcc, the memory cells MT0 to MT15 of the first string segment are turned on, and a channel voltage corresponding to the first string segment is thereby discharged to GND. The intermediate transistor ILT is biased with the source voltage Vcc applied to its gate, the ground voltage GND applied to its drain, and the program inhibit voltage Vpi applied to its source. This turns the transistor ILT on, and causes the boosted program inhibit voltage Vpi of the channel corresponding to the second string segment to be discharged to GND.

A selected memory cell MB0 (in the bit line BL1 and the word line WL0B) is programmed by the F-N tunneling created by the potential difference (corresponding to the program voltage Vpgm) between its control gate and its drain and between its control gate and its source. In other words, a substantial quantity of electrons are injected in the floating gate of the selected memory cell MB0, and a threshold voltage of the cell MT0 is shifted into a positive threshold voltage from a negative threshold voltage as a result of the program operation.

On the other hand, since the word lines WL0T to WL15T are biased with the source voltage Vcc, the memory cells MT0 to MT15 of the first string segment corresponding to the bit line BL0 are turned on, and a channel of the first string segment coupled to the bit line BL0 is thereby charged up to the source-threshold voltage Vcc-Vth. The intermediate transistor ILT is biased with the source voltage Vcc applied to its gate, the source-threshold voltage Vcc-Vth to its drain, and the program inhibit voltage Vpi to its source. This turns the intermediate transistor ILT off, and causes the boosted program inhibit voltage Vpi of the channel corresponding to the second string segment to be maintained.

An unselected memory cell MB0 (in the unselected bit line BL0 and the selected word line WL0B) is therefore program-inhibited because the potential difference sufficient to cause the F-N tunneling is not formed between its control gate and its drain and between its control gate and its source. As a result, the selected memory cell MB0 corresponding to the bit line BL0 is maintained in a depletion-type transistor state, having a negative threshold voltage corresponding to an erased state. Accordingly, since the power supply voltage Vcc is applied to the word lines WL0T to WL15T between the transistors SST and ILT, the memory cells MT0 to MT15 corresponding to the first string segment suffer no stress which would cause a threshold voltage of the cells MT0 to MT15 to change.

According to the present invention, therefore, the number of memory cells in each string can be increased without increasing the pass voltage stress, and the limitations described previously with respect to the decoder layout of the prior art can be overcome. Additionally, although the invention has been described using exemplary preferred embodiments, it is to be understood that the scope of the invention is not limited to the disclosed embodiments. Rather, various modifications and similar arrangements will be apparent to those skilled in the art. The following claims, therefore, should be accorded their broadest interpretation so as to encompass all such modifications and similar arrangements.

What is claimed is:

1. A nonvolatile semiconductor memory device comprising:

a memory cell array divided into a plurality of memory blocks;

a plurality of bit lines arranged through the plurality of memory blocks;

a plurality of word lines disposed through each of the memory blocks and arranged to intersect the bit lines; and a plurality of memory cell strings in each of the memory blocks, wherein each memory cell string corresponds to one of the bit lines, and wherein each memory cell string comprises a first string segment having a plurality of EEPROM cells, a second string segment having a plurality of EEPROM cells, a first select transistor configured to connect the first string segment to a corresponding bit line in response to a first select signal, a second select transistor configured to connect the first string segment to the second string segment in response to a second select signal, and a third select transistor configured to connect the second string segment to a common source line in response to a third select signal.

2. A memory device according to claim 1, wherein the first select transistor of each memory cell string comprises a first NMOS transistor having a drain connected to a corresponding bit line, a source connected to the first string segment, and a gate connected to receive the first select signal.

3. A memory device according to claim 2, wherein the first select signal comprises a voltage higher than a threshold voltage of the first NMOS transistor during a program operation of the EEPROM cells of the second string segment.

4. A memory device according to claim 3, wherein the common source line is configured to receive a voltage higher than a ground voltage during a program operation of the EEPROM cells of the second string segment.

5. A memory device according to claim 1, wherein the second select transistor of each memory cell string comprises a second NMOS transistor which has a drain connected to the first string segment, a source connected to the second string segment, and a gate connected to receive the second select signal.

6. A memory device according to claim 3, wherein the second select signal comprises a voltage lower than a threshold voltage of the second NMOS transistor during a program operation of the EEPROM cells of the first string segment.

7. A memory device according to claim 1, wherein the third select transistor of each memory cell string comprises a third NMOS transistor which has a drain connected to the second string segment, a source connected to the common source line, and a gate connected to receive the third select signal.

8. A memory device according to claim 4, wherein the third select signal comprises a voltage lower than a threshold voltage of the third NMOS transistor during a program operation of the EEPROM cells of the first string segment.

9. A memory device according to claim 1, wherein the second select signal comprises a voltage higher than a threshold voltage of the second select transistor during a program operation of the EEPROM cells of the second segment.

10. A memory device according to claim 1, wherein word lines connected to the EEPROM cells of the first string segment are configured to receive a voltage lower than a word line voltage which is applied to word lines connected to program inhibited cells of the second string segment during a program operation of the EEPROM cells of the second string segment.

11. A memory device according to claim 1, wherein word lines connected to the EEPROM cells of the second string segment are adapted to receive a voltage lower than a word line voltage applied to word lines connected to program-inhibited cells of the first string segment during a program operation of the EEPROM cells of the first string segment.

12. A memory device according to claim 1, wherein the common source line is configured to receive a voltage higher than a ground voltage during a program operation of the EEPROM cells of the first string segment.

13. A memory device according to claim 1, wherein the select transistors in each string of a selected memory block are configured to be biased so that gate voltages of the select transistors are floated over a predetermined voltage during an erase operation of the selected memory block.

14. A memory device according to claim 13, wherein the select transistors in each string of an unselected memory block are configured to be biased so that gate voltages of the select transistors are floated over a predetermined voltage during an erase operation of the selected memory block.

15. A method of programming the memory device of claim 1, comprising:

selecting a memory cell string for a programming operation; and performing the programming operation on the first string segment of the selected memory cell string independently of the second string segment of the selected memory cell string.

16. A method of programming the memory device of claim 1, comprising:

selecting a memory cell string for a programming operation; and performing the programming operation on a memory cell in the second string segment without subjecting memory cells in the first string segment to a pass voltage stress.

17. A method of programming a selected memory cell in a first string segment of a selected memory cell string independently of memory cells in a second string segment of the selected memory cell string to avoid creating a pass voltage stress in the memory cells of the second string segment, said method comprising:

supplying a program voltage to the first string segment;

supplying a program-inhibit voltage to unselected memory cells in the first string segment; and supplying a voltage lower than the program-inhibit voltage to word lines of memory cells in the second string segment.

18. A method of reducing pass voltage stress in a semiconductor memory device having a plurality of string segments by performing an operation on a first string segment of the memory device independent of a second string segment of the memory device, said method comprising:

supplying a first voltage to the first string segment;

supplying a inhibit voltage to unselected memory cells in the first string segment; and supplying a second voltage lower than the inhibit voltage to memory cells in the second string segment.

* * * * *

UNITED STATES PATENT AND TRADEMARK OFFICE
CERTIFICATE OF CORRECTION

| | | |
|---|---|---|
| PATENT NO. | : 6,285,587 B1 | Page 1 of 1 |
| APPLICATION NO. | : 09/593259 | |
| DATED | : October 30, 2001 | |
| INVENTOR(S) | : Seok-Cheon Kwon | |

It is certified that error appears in the above-identified patent and that said Letters Patent is hereby corrected as shown below:

Column 5, line 33, "M15" should read --MB15--
Column 7, line 9, "WLIT" should read --WL1T--
Column 10, line 13, "first string" should read --second string--

Signed and Sealed this

Seventeenth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,285,587 B1 | |
| APPLICATION NO. | : 09/593259 | |
| DATED | : September 4, 2001 | |
| INVENTOR(S) | : Seok-Cheon Kwon | |

It is certified that error appears in the above-identified patent and that said Letters Patent is hereby corrected as shown below:

Column 5, line 33, "M15" should read --MB15--
Column 7, line 9, "WLIT" should read --WL1T--
Column 10, line 13, "first string" should read --second string--

This certificate supersedes Certificate of Correction issued July 17, 2007.

Signed and Sealed this

Fourth Day of September, 2007

JON W. DUDAS
*Director of the United States Patent and Trademark Office*